(12) United States Patent
Miyazaki et al.

(10) Patent No.: US 10,847,364 B2
(45) Date of Patent: Nov. 24, 2020

(54) LAMINATED BODY AND SEMICONDUCTOR DEVICE

(71) Applicant: Kabushiki Kaisha Toshiba, Minato-ku (JP)

(72) Inventors: Hisao Miyazaki, Yokohama (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/290,442

(22) Filed: Mar. 1, 2019

(65) Prior Publication Data

US 2019/0348284 A1    Nov. 14, 2019

(30) Foreign Application Priority Data

May 10, 2018 (JP) .................... 2018-091273
Feb. 26, 2019 (JP) .................... 2019-032985

(51) Int. Cl.
*H01L 21/02* (2006.01)
*H01L 29/16* (2006.01)
(Continued)

(52) U.S. Cl.
CPC .... *H01L 21/02488* (2013.01); *H01L 21/0228* (2013.01); *H01L 21/0262* (2013.01); *H01L 21/02145* (2013.01); *H01L 21/02164* (2013.01); *H01L 21/02175* (2013.01); *H01L 21/02178* (2013.01); *H01L 21/02181* (2013.01); *H01L 21/02381* (2013.01); *H01L 21/02433* (2013.01); *H01L 21/02516* (2013.01); *H01L 21/02527* (2013.01); *H01L 21/02609* (2013.01); *H01L 21/041* (2013.01); *H01L 21/043* (2013.01); *H01L 21/7624* (2013.01); *H01L 29/045* (2013.01); *H01L 29/1602* (2013.01);
(Continued)

(58) Field of Classification Search
CPC ......... H01L 21/02527; H01L 21/02436; H01L 21/02488
See application file for complete search history.

(56) References Cited

U.S. PATENT DOCUMENTS 4,404,265 A * 9/1983 Manasevit .......... H01L 21/0242
                                                    117/104
5,015,528 A    5/1991 Pinneo
(Continued)

FOREIGN PATENT DOCUMENTS

JP          64-14196       1/1989
JP          9-309794      12/1997
JP         2002-100958     4/2002

OTHER PUBLICATIONS

S. Gsell, et al., "A route to diamond wafers by epitaxial deposition on silicon via iridium/yttria-stabilized zirconia buffer layers", Applied Physics Letters, vol. 84, No. 22, 2004, 4 pages.
(Continued)

*Primary Examiner* — Mohammed Shamsuzzaman
*Assistant Examiner* — Khatib A Rahman
(74) *Attorney, Agent, or Firm* — Oblon, McClelland, Maier & Neustadt, L.L.P.

(57) ABSTRACT

A laminated body of an embodiment includes: a silicon layer; a first beryllium oxide layer on the silicon layer; and a diamond semiconductor layer on the first beryllium oxide layer.

15 Claims, 5 Drawing Sheets

(51) Int. Cl.
*H01L 29/51* (2006.01)
*H01L 29/786* (2006.01)
*H01L 29/04* (2006.01)
*H01L 21/04* (2006.01)
*H01L 21/762* (2006.01)
*H01L 29/66* (2006.01)

(52) U.S. Cl.
CPC .......... *H01L 29/513* (2013.01); *H01L 29/517* (2013.01); *H01L 29/66045* (2013.01); *H01L 29/78603* (2013.01); *H01L 29/78684* (2013.01); *H01L 21/044* (2013.01)

(56) References Cited

U.S. PATENT DOCUMENTS

| | | | | |
|---|---|---|---|---|
| 5,268,217 | A * | 12/1993 | Kimock | C03C 17/3626 428/216 |
| 9,142,618 | B2 * | 9/2015 | Suzuki | H01L 21/02502 |
| 2005/0127373 | A1 * | 6/2005 | Yokota | H01L 29/78 257/77 |
| 2005/0202665 | A1 * | 9/2005 | Namba | H01L 21/02609 438/607 |
| 2005/0280000 | A1 * | 12/2005 | Ishii | H01L 27/1052 257/67 |
| 2012/0223338 | A1 * | 9/2012 | Mitani | H01L 21/02247 257/77 |
| 2013/0161648 | A1 * | 6/2013 | Khan | H01L 21/2855 257/77 |
| 2013/0181189 | A1 * | 7/2013 | Bertin | G06F 30/30 257/29 |
| 2014/0145314 | A1 * | 5/2014 | Wang | H01L 21/28255 257/649 |

OTHER PUBLICATIONS

Seung Min Lee, et al., "Advanced Silicon-on-Insulator: Crystalline Silicon on Atomic Layer Deposited Beryllium Oxide", Scientific Reports 7, 13205, 2017, 7 pages.

Alberto Argoitia, et al., "Diamond grown on single-crystal beryllium oxide", Journal of Applied Physics, vol. 73, No. 9, 1993, 9 pages.

* cited by examiner

LAMINATED BODY AND SEMICONDUCTOR DEVICE

CROSS-REFERENCE TO RELATED APPLICATION

This application is based upon and claims the benefit of priority from Japanese Patent Applications No. 2018-091273, filed on May 10, 2018 and No. 2019-032985 filed on Feb. 26, 2019; the entire contents of which are incorporated herein by reference.

FIELD

Embodiments described herein relate to a laminated body and a semiconductor device.

BACKGROUND

Diamond has good mechanical, chemical and thermal characteristics and, in addition, good semiconductor characteristics, and therefore is gaining attention as a semiconductor device material. Particularly, diamond has a band gap of approximately 5.5 eV at a room temperature and has a high breakdown resistance, and therefore is expected as a power device material. Furthermore, diamond has the robust crystalline nature, and therefore is expected as an environmental resistant device material used under hard environment such as a high temperature and radiation. Therefore, there are reports related to diamond semiconductor devices such as Schottky barrier diodes having a Schottky barrier junction, devices of a PIN structure and field effect transistors.

It is proposed that, when a semiconductor device is manufactured by using diamond, a diamond layer is formed on a substrate including an Ir layer by a CVD method and is peeled, and a diamond layer applied to another substrate is used. However, substrate cost is high and quality lowers during a peeling process, and therefore it is demanded to directly form a high quality diamond semiconductor layer on a low-cost silicon (Si) substrate.

However, a lattice mismatch rate of diamond and the Si substrate is high, and therefore it is difficult to form a uniform and high quality diamond semiconductor layer on Si. Hence, it is demanded to provide a laminated body which includes a uniform and high quality diamond semiconductor layer on a silicon substrate, and a semiconductor device for which the laminated body is used.

DETAILED DESCRIPTION

Figure 1:
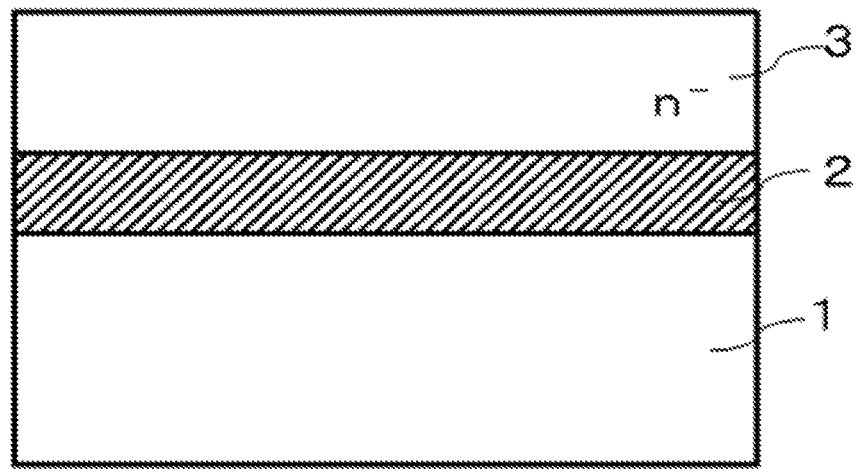
FIG. 1 is a schematic cross-sectional view of a laminated body according to a first embodiment.

A laminated body of an embodiment includes: a silicon layer; a first beryllium oxide layer on the silicon layer; and a diamond semiconductor layer on the first beryllium oxide layer.

Embodiments of the present disclosure will be described below with reference to the drawings. Components assigned the same reference numerals will indicate the same components. In addition, the drawings are schematic or conceptual, and a relationship between the thickness and the width of each component, and a ratio coefficient of sizes between components are not necessarily the same as actual ones. Furthermore, even when the same components will be described, respective dimensions and ratio coefficients will be illustrated differently in the drawings in some cases.

An upper direction in the drawings will be described as "upper" and a lower direction in the drawings will be referred to as "lower" to indicate a positional relationship between parts. Concepts of "upper" and "lower" in this description are not necessarily terms indicating a relationship with a gravity direction.

In this description, an i-type semiconductor refers to an intrinsic semiconductor. The intrinsic semiconductor means a semiconductor in which an n-type or p-type dopant is not actively introduced. A dopant which is inevitably introduced as the semiconductor is manufactured is permitted.

First Embodiment

FIG. 1 illustrates a schematic cross-sectional view of a laminated body 100.

The laminated body 100 is formed by laminating a first beryllium oxide (BeO) layer 2 and a diamond semiconductor layer 3 in order on a silicon (Si) layer 1.

The laminated body 100 is used for electronic parts of semiconductor devices such as field effect transistors, detection devices such as sensors, electron emission sources and superconductor devices.

A lattice constant of the silicon layer 1 and a lattice constant of the diamond semiconductor layer 3 significantly differ, and a lattice mismatch rate of these lattice constants is high. Hence, in the present embodiment, when the diamond semiconductor layer 3 is formed on the silicon layer 1, a beryllium oxide having a lattice constant which takes an intermediate value of the lattice constant of the silicon layer 1 and the lattice constant of the diamond semiconductor layer 3 is formed as a buffer layer between the silicon layer 1 and the diamond semiconductor layer 3. Preferably, a plane orientation of the silicon layer 1 is a (111) plane, a plane orientation of the first beryllium oxide layer 2 is a (0001) plane and a plane orientation of the diamond semiconductor layer 3 is a (111) plane.

When the beryllium oxide is grown on, for example, the (111) plane of silicon, crystals readily grow on the (0001) plane of the beryllium oxide (BeO) having the same rotational symmetry as that of the (111) plane of the silicon. In this case, the beryllium oxide receives a compressive stress from the silicon. This is because a three-fold value of an interval (2.66 Å) of beryllium atoms on the (0001) plane of the beryllium oxide is larger than a two-fold value of an interval (3.83 Å) of silicon atoms on the (111) plane of the silicon. Consequently, the (0001) plane of the beryllium oxide is compressed, and an interval between beryllium atoms on (0001) plane of the beryllium oxide becomes close to an interval between carbon atoms of diamond, so that it is possible to grow the diamond on the beryllium oxide. That is, by laminating the silicon, the beryllium oxide and the diamond in order, it is possible to form uniform and high quality diamond.

Figure 2:
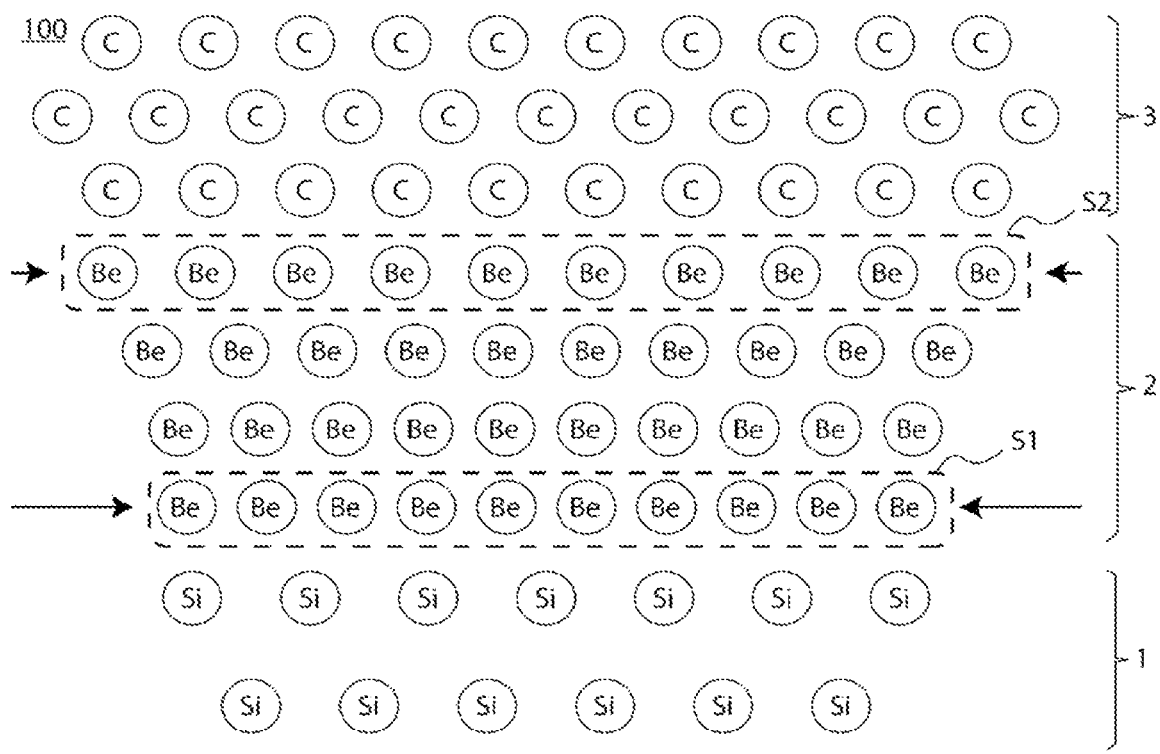
FIG. 2 is a schematic view of the laminated body according to the first embodiment.

FIG. 2 illustrates a schematic view of the laminated body 100 according to the embodiment. The schematic view of FIG. 2 is a view for understanding a difference between an interval of the silicon atoms of the silicon layer 1 and an interval of beryllium atoms of the first beryllium oxide layer 2 described in the above paragraph, and a difference between an interval of the beryllium atoms of the first beryllium oxide layer 2 and an interval of carbon atoms of the diamond semiconductor layer 3. The (111) plane of the silicon layer 1 and the (0001) plane of the first beryllium oxide layer 2 form an interface. The (0001) plane of the first beryllium oxide layer 2 and the (111) plane of the diamond form an interface. Circles in FIG. 2 indicate atoms, and element symbols (Si, Be and C) of the atoms are indicated in the circles. A1 which represents an interval of the silicon atoms of the (111) plane of the silicon is 3.84 Å. A2 which represents an interval of the beryllium atoms of the (0001) plane of the beryllium oxide is 2.70 Å. An interval A3 of the carbon atoms of the (111) plane of the diamond is 2.52 Å. FIG. 2 illustrates such a relationship that a two-fold value of the interval A1 of the silicon atoms of the silicon is close to a three-fold value of the interval A2 of the beryllium atoms of the beryllium oxide (2×A1≈3×A2), and the interval A2 of the beryllium atoms of the beryllium oxide is close to the interval A3 of the carbon atoms of the diamond (A2≈A3). In the laminated body 100 according to the embodiment, the first beryllium oxide layer 2 receives a compressive stress from the silicon layer 1. Therefore, the diamond semiconductor layer 3 on the first beryllium oxide layer 2 is hetero-epitaxially grown from the first beryllium oxide layer 2 receiving the compressive stress. The diamond semiconductor layer 3 is readily hetero-epitaxially grown, and therefore has a large area and a good crystalline nature. This diamond semiconductor layer 3 has less grain boundaries, and high effective mobility. It is possible to grow diamond from a single beryllium oxide layer (which does not receive the compressive stress from the silicon layer 1). However, a misfit is great, and therefore only small diamond crystals (single crystal or polycrystal) which have an island shape at maximum and whose area is approximately 100 μm² can be obtained. It is impossible or difficult for the small diamond crystals to form a semiconductor element. Even when an operation of a semiconductor element can be checked at a laboratory scale by using these small diamond crystals, these small diamond crystals do not make it possible to mass-produce semiconductor elements, and therefore are not industrially useful. On the other hand, it is possible to grow large diamond crystals at an order of mm² in the laminated body 100 according to the embodiment, and consequently industrially use the laminated body 100 to manufacture semiconductor elements. In addition, FIG. 2 exaggerates a change in atom intervals for ease of understanding of the compressive stress and an expansion stress.

The two-fold value of the interval A1 of the silicon atoms of the silicon layer is close to the three-fold value of the interval A2 of the beryllium atoms of the beryllium oxide layer, and 8.10 Å which is three times as A2 is 4% larger than 7.68 Å which is twice as A1 ([8.10-7.68]/7.68=0.055). That is, the interval of the beryllium oxide of the first beryllium oxide layer 2 which is provided on the silicon layer 1 (and hetero-epitaxially grown) is reduced when the compressive stress from the silicon layer 1 is received. Hence, the interval of the beryllium atoms of the (0001) plane of the first beryllium oxide layer 2 provided on the silicon layer 1 is reduced to equal to or more than 2.56 Å or more and 2.65 Å or less. The interval of the beryllium atoms of the (0001) plane of the first beryllium oxide layer 2 on a side of the silicon layer 1 is narrower than the interval of the beryllium atoms of the (0001) plane of the first beryllium oxide layer 2 on a side of the diamond semiconductor layer 3. That is, the compressive stress which the silicon layer 1 applies to the first beryllium oxide layer 2 decreases in the first beryllium oxide layer 2 from the side of the silicon layer 1 to the side of the diamond semiconductor layer 3. An interval A4 of the beryllium atoms of the (0001) plane of the first beryllium oxide layer 2 which is in direct contact with the silicon layer 1 (an inter-beryllium atom distance) of the beryllium oxide (an atom layer S1 in FIG. 2) which is the closest to the silicon layer 1) is equal to or more than 2.56 Å and equal to or less than 2.65 Å. That is, FIG. 2 illustrates the strength of the compressive stress as solid line arrows. When the compressive stress becomes small, the misfit of the first beryllium oxide layer 2 and the diamond semiconductor layer 3 becomes significant, and therefore the thin first beryllium oxide layer 2 is preferable. A interval A5 of the beryllium atoms of the (0001) plane of the first beryllium oxide layer 2 which is in direct contact with the diamond semiconductor layer 3 (an inter-beryllium atom distance) of the beryllium oxide (an atom layer S2 in FIG. 2) which is the closest to the diamond semiconductor layer 3) is equal to or more than 2.56 Å and equal to or less than 2.65 Å. In addition, the misfit of the silicon layer 1 and the first beryllium oxide layer 2 is relatively little, so that it is possible to epitaxially grow the first beryllium oxide layer 2 of a large area on the silicon layer 1.

Next, a relationship between the diamond semiconductor layer 3 and the first beryllium oxide layer 2 will be described. As described above, the interval A2 of the beryllium atoms of the beryllium oxide layer is close to the interval A3 of the carbon atoms of the diamond, and the interval A3 of the carbon atoms of the diamond is shorter by about 7% than the interval A2 of the beryllium atoms of the beryllium oxide layer. When there is a difference of about 7%, diamond crystals to be formed are small and are not industrially practical as described above. The difference between the intervals of the beryllium oxide and the diamond is greater than that of the beryllium oxide, and therefore when the configuration of the embodiment is not employed, it is difficult to grow crystals of a large area. The inter-beryllium atom distance of the first beryllium oxide layer 2 on the side of the diamond semiconductor layer 3 is reduced to equal to or more than 2.56 Å and equal to or less than 2.65 Å. Therefore, the interval of the carbon atoms of the (111) plane of the diamond semiconductor layer 3 is shorter by 2% or more and 5° or less than the interval of the beryllium atoms of the (0001) plane of the first beryllium oxide layer 2 which is in direct contact with the diamond semiconductor layer 3 of the first beryllium oxide layer 2 provided on the silicon layer 1. This means that the first beryllium oxide layer 2 receives the compressive stress from the silicon layer 1, and therefore the misfit of the first beryllium oxide layer 2 and the diamond semiconductor layer 3 becomes little. The difference between the interval between the beryllium atoms and the interval of the carbon atoms which face each other is equal to or less than 5% and this difference becomes equal to or less than 5% or less from about 7%, so that growth of diamond crystals significantly improves and it is possible to obtain the diamond semiconductor layer 3 containing the diamond crystals of the large area. The diamond semiconductor layer 3 according to the embodiment has high effective mobility, so that, by machining the diamond semiconductor layer 3, it is possible to obtain semiconductor elements of good characteristics. The interval of the carbon atoms of the (111) plane of the diamond semiconductor layer 3 is shorter than the interval of the beryllium atoms of the (0001) plane of the first beryllium oxide layer 2, and therefore the (111) plane of the carbon atoms of the diamond semiconductor layer 3 receives the expansion stress. The diamond semiconductor layer 3 according to the embodiment causes a little misfit, so that it is possible to suitably epitaxially grow the diamond semiconductor layer 3 from the first beryllium oxide layer 2 which is receiving the compressive stress.

A distance D1 which is twice as the interval A1 of the silicon atoms of the silicon, and a distance D2 which is three times as the interval A2 of the beryllium atoms of the beryllium oxide have a relationship of D1<D2. Furthermore, a distance D3 which is one time as the interval A2 of the beryllium atoms of the beryllium oxide and a distance D4 which is one time as the interval A3 of the carbon atoms of the diamond have a relationship of D3>D4. That is, layers which are laminated in order of a small layer, a large layer and a small layer from the silicon layer 1 to the diamond semiconductor layer 3 are laminated to have a good heteroepitaxial relationship. By satisfying this relationship, the first beryllium oxide layer 2 which is the intermediate layer is considered to function as a buffer layer which is very suitable for growth of the diamond semiconductor layer 3 compared to a case where a size relationship changes in one direction in order of, for example, a large layer, a medium layer and a small layer.

Furthermore, the beryllium oxide has a large band gap (approximately 10.6 eV) and has a high insulation property. Consequently, the first beryllium oxide layer 2 can electrically insulate the silicon layer 1 and the diamond semiconductor layer 3.

Furthermore, the first beryllium oxide layer 2 which is an oxide has a high thermal conductivity (approximately 3.3 W/(cm·K)). The silicon and the diamond also have a high thermal conductivity, so that, by using the beryllium oxide, it is possible to realize a semiconductor device having high heat dissipation when the laminated body 100 is used for the semiconductor device.

The laminated body 100 will be described in more detail below.

A commercially available silicon substrate can be used for the silicon (Si) layer 1. The plane orientation of the silicon layer 1 is, for example, the (111) plane. The silicon layer 1 supports the first beryllium oxide layer 2 and the diamond semiconductor layer 3. The thickness of the silicon layer 1 is desirably, for example, equal to or more than 10 μm and equal to or less than 1000 μm.

The first beryllium oxide (BeO) layer 2 is provided on the silicon layer 1. The plane orientation of the first beryllium oxide (BeO) layer 2 is desirably the (0001) plane when easiness of hetero-epitaxial growth is taken into account. Furthermore, the (0001) plane which is the plane orientation of the first beryllium oxide layer 2 has the same rotational symmetry as that of the (111) plane which is the plane orientation of the silicon layer 1. Consequently, it is easy to grow the first beryllium oxide layer 2 which is the (0001) plane on the silicon layer 1 which is the (111) plane.

Although, when the first beryllium oxide layer 2 is laminated, the silicon layer 1 is heated, the thickness of the first beryllium oxide layer 2 is desirably, for example, equal to or less than 100 nm to prevent an occurrence of warping and a crack of the silicon layer 1 while the silicon layer 1 is heated. Furthermore, when the compressive stress which the first beryllium oxide layer 2 receives from the silicon layer 1 is taken into account, the thickness of the first beryllium oxide layer 2 is more desirably, for example, equal to or less than 10 nm to prevent a defect caused by misfit dislocation.

When, for example, a beryllium oxide layer whose thickness is equal to or more than 100 nm is formed on a silicon layer, a compressive stress from the silicon layer becomes very little on a surface of the beryllium oxide layer on a side opposite to the side of the silicon layer. When the compressive stress from the silicon layer 1 to the first beryllium oxide layer 2 becomes little, the misfit of the first beryllium oxide layer 2 and the diamond semiconductor layer 3 becomes significant, and therefore the thickness of the first beryllium oxide layer 2 is preferably thin. When the misfit is taken into account, the thickness of the first beryllium oxide layer 2 is preferably equal to or more than one layer (2.66 Å), is more preferably equal to or more than one layer and equal to or less than 50 Å, and is still more preferably equal to or more than one layer and equal to or less than 3 nm. When the thickness of the first beryllium oxide layer 2 is too thin, a defect of the first beryllium oxide layer 2 is readily produced, and, when there is a hole which is the defect, the diamond semiconductor layer 3 hardly heteroepitaxially grows. Therefore, the thickness of the first beryllium oxide layer 2 is preferably equal to or more than two layers (5.32 Å) and is more preferably equal to or more than two layers and equal to or less than 50 Å.

Furthermore, the band gap of the beryllium oxide is larger than the band gap of the diamond, and therefore the first beryllium oxide layer 2 functions as an insulation layer of the diamond semiconductor layer 3. When the thickness of the first beryllium oxide layer 2 is thin, the insulation property and reliability of insulation lower. Hence, the thickness of the first beryllium oxide layer 2 is preferably equal to or more than ten layers (26.6 Å). Furthermore, the first beryllium oxide layer 2 has the high thermal conductivity, and easily emits heat generated by the diamond semiconductor layer 3 from the first beryllium oxide layer 2. When the thermal conductivity is taken into account, the thickness of the first beryllium oxide layer 2 is preferably 10 layers or more.

When both of the compressive stress and the insulation property are taken into account, the thickness of the first beryllium oxide layer 2 is preferably equal to or more than ten layers (26.6 Å) and equal to or less than 50 Å.

In addition, the first beryllium oxide layer 2 may contain one or more types unintentionally selected from a group consisting of hydrogen (H), boron (B), carbon (C), nitrogen (N), magnesium (Mg), aluminum (Al), silicon (Si) and phosphorous (P).

The diamond semiconductor layer 3 is provided on the first beryllium oxide layer 2. The plane orientation of the diamond semiconductor layer 3 is, for example, the (111) plane. The diamond semiconductor layer 3 which is the (111) plane and the first beryllium oxide layer 2 which is the (0001) plane are compatible in terms of rotational symmetry. Consequently, it is easy to grow the diamond semiconductor layer 3 which is the (111) plane on the first beryllium oxide layer 2 which is the (0001) plane.

The diamond semiconductor layer 3 has an i-type or a first conductivity type. The first conductivity type is, for example, an n-type. The diamond semiconductor layer 3 may be the n-type due to a small amount of impurity mixed without being intentionally doped. An n-type impurity of the diamond semiconductor layer 3 is, for example, phosphorous (P). The diamond semiconductor layer 3 is desirably weak n-type conduction to obtain a pressure resistance. This n-type conduction is illustrated as n in FIG. 1. An impurity concentration of the conductivity type of the diamond semiconductor layer 3 is, for example, equal to or more than $1\times10^{15}$ cm$^{-3}$ and equal to or less than $1\times10^{22}$ cm$^{-3}$. Furthermore, when a tensile stress which the diamond semiconductor layer 3 receives from the first beryllium oxide layer 2 is taken into account, the thickness of the diamond semiconductor layer 3 is desirably equal to or more than 1 nm and may have an optional thickness as long as the thickness is equal to or more than 1 nm to prevent a defect caused by misfit dislocation. The thickness of the diamond semiconductor layer 3 is desirably, for example, equal to or more than 1 nm and equal to or less than 100 nm.

In the laminated body 100 according to the present embodiment, the diamond semiconductor layer 3 receives the tensile stress from the first beryllium oxide layer 2, and therefore the lattice of the (111) plane of the diamond semiconductor layer 3 widens. Consequently, the impurity having a larger atom radius than the carbon atoms such as phosphorous (P) is readily doped with the diamond semiconductor layer 3.

Furthermore, conventionally, when diamond is made, the diamond is grown on an iridium (Ir) layer. However, the iridium layer is not an insulation body, and, when, for example, the iridium layer is used for use which requires the insulation body as an underlayer of diamond such as a semiconductor device, the iridium layer needs to be peeled from the diamond. In the case of the laminated body 100 according to the present embodiment, the diamond semiconductor layer 3 is formed on the first beryllium oxide layer 2 which is the insulation layer, so that the laminated body 100 can be used as is for semiconductor devices.

Furthermore, the first beryllium oxide layer 2 has the high quality crystalline nature, and consequently can prevent a defect at the interface between the first beryllium oxide layer 2 and the diamond semiconductor layer 3, prevent scattering of electrons or holes deriving from the defect at the interface, and improve carrier mobility in the diamond layer.

A making method of the laminated body 100 will be described below.

First, a commercially available silicon substrate is prepared as the silicon layer 1.

The first beryllium oxide layer 2 is formed on the silicon layer 1 by an atomic layer deposition (ALD) method. As a raw material gas of the ALD method, a mixed gas containing dimethylberyllium (Be(CH$_3$)$_2$) or diethylberyllium (Be(C$_2$H$_5$)$_2$), and water (H$_2$O) or ozone (O$_3$) is used. When the first beryllium oxide layer 2 is formed by the ALD method, the temperature of the silicon layer 1 is 250° C.

Next, the diamond semiconductor layer 3 is formed on the first beryllium oxide layer 2 by a CVD method. As a raw material gas of the CVD method, hydrocarbon such as methane (CH$_3$) is used. When an n-type region is formed, a phosphorous raw material gas such as phosphine (PH$_3$) is added to the raw material gas to form the diamond layer containing the phosphorous as the impurity. The n-type region may be laminated on the (111) plane taking into account that the phosphorous is readily taken in.

Although the n-type impurity is preferably phosphorous (P) taking into account easiness to replace carbon contained in the diamond semiconductor layer 3, it is also possible to apply nitrogen (N), arsenic (As), antimony (Sb) or sulfur (S).

Furthermore, the present embodiment has described the conductivity type of the diamond semiconductor layer 3 as the n-type. However, the conductivity type of the diamond semiconductor layer 3 may be a p-type. When the diamond semiconductor layer 3 is the p-type, for example, boron (B) is used for a p-type impurity.

Figure 3:
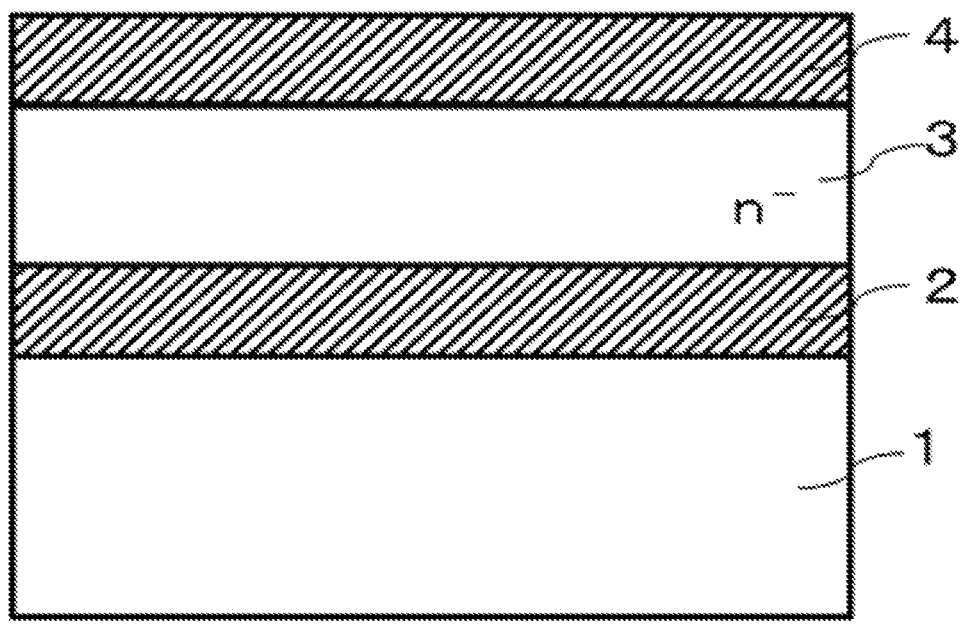
FIG. 3 is a schematic cross-sectional view of the laminated body according to the first embodiment.

FIG. 3 illustrates a laminated body 101 which is a modified example of the laminated body 100 in FIG. 1.

The laminated body 101 in FIG. 3 differs from the laminated body 100 in FIG. 1 in further including a second beryllium oxide layer 4 as a first insulation layer on the diamond semiconductor layer 3. As the first insulation layer, an oxide layer such as a silicon dioxide (SiO$_2$) layer, an aluminum oxide (Al$_2$O$_3$) layer and an aluminum silicate (Al$_x$Si$_y$O$_2$) layer can be additionally used. That is, the first insulation layer is one or more types selected from a group consisting of the second beryllium oxide layer, the silicon oxide layer, the aluminum oxide layer and the aluminum silicate layer. The diamond semiconductor layer 3 of the laminated body 101 is sandwiched between the first beryllium oxide layer 2 and the first insulation layer. These layers can be also laminated by using a plurality of the above-described oxide layers as the first insulation layers. Although the second beryllium oxide layer 4 will be described as an example of the first insulation layer, the same applies to a mode, too, that an oxide layer formed by other materials is used as the first insulation layer.

The second beryllium oxide layer 4 is provided on the diamond semiconductor layer 3. The material of the second beryllium oxide layer 4 is the same as that of the above first beryllium oxide layer 2.

While the first beryllium oxide layer 2 can be used as the buffer layer for forming the diamond, the second beryllium oxide layer 4 can be used as an insulation layer such as a gate insulation film of the semiconductor device and the diamond semiconductor layer 3 can be used as a channel layer through which carriers pass.

The thickness of the second beryllium oxide layer 4 is desirably, for example, equal to or more than 3 nm or more and equal to or less than 1000 nm from a viewpoint of the insulation property. Particularly when the laminated body 101 is used for the semiconductor device and the second beryllium oxide layer 4 is used as, for example, the gate insulation film, the thickness of the second beryllium oxide layer 4 is desirably, for example, equal to or more than 3 nm and equal to or less than 200 nm to prevent leakage of carriers of the diamond semiconductor layer 3 to the side of the gate electrode.

The second beryllium oxide layer 4 has a high quality crystalline nature, and consequently prevent a defect at the interface between the second beryllium oxide layer 4 and the diamond semiconductor layer 3.

Consequently, it is possible to prevent scattering of electrons or holes deriving from the defect at the interface, and improve carrier mobility.

Figure 4:
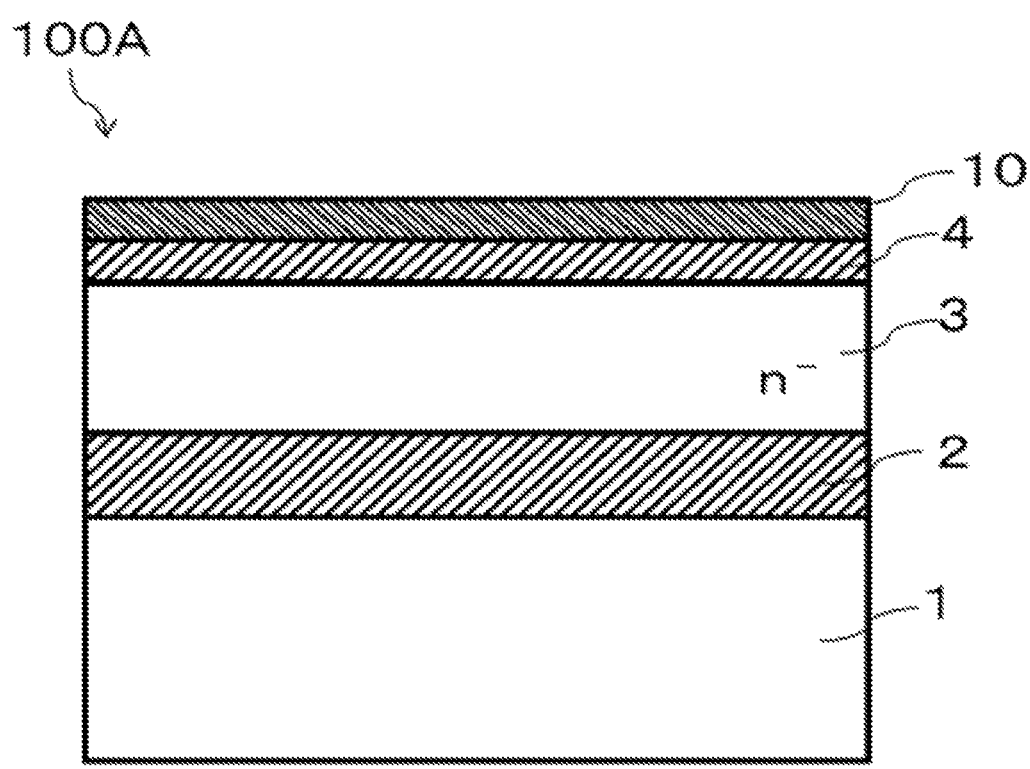
FIG. 4 is a schematic cross-sectional view of the laminated body according to the first embodiment.

FIG. 4 illustrates a laminated body 100A which is a modified example of the laminated body 101 in FIG. 3.

The laminated body 100A in FIG. 4 differs from the laminated body 101 in FIG. 3 in further including the second beryllium oxide layer 4 and a second insulation layer 10 on the diamond semiconductor layer 3.

The second insulation layer 10 is provided on the second beryllium oxide layer 4. The second insulation layer 10 is an insulation layer of a different material from the beryllium oxide layer, and is a layer of at least one type of a material selected from, for example, the silicon dioxide layer (SiO$_2$), the aluminum oxide (Al$_2$O$_3$) and the hafnium oxide (HfO$_2$). The second insulation layer 10 may be obtained by laminating layers of a plurality of different materials.

To suppress a use amount of the beryllium oxide, the laminated body 100A is provided with the second insulation layer 10 on the second beryllium oxide layer 4, so that it is possible to make the second beryllium oxide layer 4 thin while keeping the necessary thickness for the insulation property, and suppress the use amount.

The total thickness of the second beryllium oxide layer 4 and the second insulation layer 10 is desirably, for example, equal to or more than 3 nm and equal to or less than 1000 nm from a viewpoint of the insulation property. Particularly, when the laminated body 100A is used for the semiconductor device and the second beryllium oxide layer 4 and the second insulation layer 10 are used as gate insulation films, the total thickness of the second beryllium oxide layer 4 and the second insulation layer 10 is desirably, for example, equal to or more than 3 nm and equal to or less than 200 nm to prevent leakage of carriers of the diamond semiconductor layer 3 to the side of the gate electrode.

When an insulation layer other than the beryllium oxide is directly laminated on the diamond semiconductor layer 3, multiple interface traps are formed between the diamond semiconductor layer 3 and the insulation layer other than the beryllium oxide. Furthermore, when the insulation layer other than the beryllium oxide is a high-k film such as hafnium oxide ($HfO_2$), remote phonon scattering lowers the carrier mobility. Therefore, it is preferable to use the second beryllium oxide layer 4 as the first insulation layer on the diamond semiconductor layer 3. The second insulation layer 10 can be further provided on the second beryllium oxide layer 4. The second insulation layer 10 is preferably one or more types of oxide layers selected from a group consisting of silicon dioxide ($SiO_2$), aluminum oxide ($Al_2O_3$) and hafnium oxide ($HfO_2$). The second insulation layer 10 and the diamond can be used together.

Second Embodiment

FIG. 4 illustrates a schematic cross-sectional view of a semiconductor device 200.

The same portions as those of a laminated body 101 in FIG. 3 will be assigned the same reference numerals, and description thereof will be omitted.

In a semiconductor device 200, a first beryllium oxide layer 2, a diamond semiconductor layer 3 and a second beryllium oxide layer 4 are laminated in order on a silicon layer 1. Furthermore, a source electrode 5, a drain electrode 6 and a gate electrode 7 are provided on the diamond semiconductor layer 3, and the second beryllium oxide layer 4 is provided between the gate electrode 7 and the diamond semiconductor layer 3.

The semiconductor device 200 is a field effect transistor (FET) which uses the laminated body 101 as a semiconductor layer.

The source electrode 5 and the drain electrode 6 are provided on the diamond semiconductor layer 3. The source electrode 5 and the drain electrode 6 are, for example, polysilicon. The source electrode 5 and the drain electrode 6 are in contact with the diamond semiconductor layer 3, and are in contact with regions 8 of the diamond semiconductor layer 3 described later in particular.

The gate electrode 7 is provided on the second beryllium oxide layer 4. The gate electrode 7 is, for example, polysilicon, silicide or a metal. When the gate electrode 7 is the polysilicon, the gate electrode 7 is doped with one or more types selected from a group consisting of boron (B), aluminum (Al), phosphorous (P) and arsenic (As). When the gate electrode 7 is the silicide, this silicide contains one or more elements selected from a group consisting of molybdenum (Mo), tantalum (Ta) and tungsten (W). When the gate electrode 7 is the metal, this metal contains one or more elements selected from a group consisting of nickel (Ni), titanium (Ti), aluminum (Al), platinum (Pt), chromium (Cr), palladium (Pd), cobalt (Co), tungsten (W), molybdenum (Mo), tantalum (Ta), niobium (Nb), vanadium (V), zirconium (Zr) and gold (Au).

The regions 8 are included in the diamond semiconductor layer 3. There are the two regions 8 which are provided near a plane on which the diamond semiconductor layer 3 and the source electrode 5 are in contact and near a plane on which the diamond semiconductor layer 3 and the drain electrode 6 are in contact. The regions 8 have a second conductivity type. The second conductivity type of the region 8 is, for example, a p-type. A p-type impurity is, for example, boron (B). To prevent a Schottky barrier due to junction between the regions 8 and the source electrode 5 and between the drain electrode 6 and the source electrode 5, an impurity concentration of the regions 8 is a higher concentration than other regions of the diamond semiconductor layer 3. p-type regions of the high concentration are indicated by $p^+$ in FIG. 5. The impurity concentration of the regions 8 is, for example, equal to or more than $1 \times 10^{19}$ cm$^{-3}$ and equal to or less than $1 \times 10^{22}$ cm$^{-3}$. In a direction from the second beryllium oxide layer 4 to the silicon layer 1, the thicknesses of the regions 8 are, for example, equal to or more than 1 nm and equal to or less than 300 nm.

The second beryllium oxide layer 4 has a large band gap (approximately 10.6 eV), and therefore is used as the gate insulation film of the semiconductor device 200. The thickness of the second beryllium oxide layer 4 is desirably, for example, equal to or more than 3 nm or more and equal to or less than 1000 nm from a viewpoint of the insulation property. Particularly, to prevent leakage of carriers of the diamond semiconductor layer 3 to the side of the gate electrode, the thickness of the second beryllium oxide layer 4 is desirably, for example, equal to or more than 3 nm and equal to or less than 200 nm.

An operation of the semiconductor device 200 will be described below.

In the semiconductor device 200, channels in which currents flow are formed in the region 8 on the side of the source electrode 5, the diamond semiconductor layer 3 between the two regions 8 and the region 8 on the side of the drain electrode 6. The current flows in an arrow direction indicated by a dotted line in FIG. 5.

To cause the currents to flow to the channels, a negative voltage is applied to the gate electrode 7. When the negative voltage is applied to the gate electrode 7, there are holes which become carriers in the diamond semiconductor layer 3 under the gate electrode 7, and the currents flow.

A function and an effect of the semiconductor device 200 will be described below.

The diamond semiconductor layer 3 receives a tensile stress from the first beryllium oxide layer 2, and therefore a lattice in the structure of the diamond semiconductor layer 3 widens. Hence, a p-type impurity such as boron (B) and an n-type impurity such as phosphorous (P) are readily doped with the diamond semiconductor layer 3. Consequently, the regions 8 can be the p-type of the high concentration in the semiconductor device 200.

The first beryllium oxide layer 2 has high thermal conductivity. The silicon layer 1 and the diamond semiconductor layer 3 also have the high thermal conductivity, so that, by using the first beryllium oxide layer 2, it is possible to realize the semiconductor device 200 of high heat dissipation.

The first beryllium oxide layer 2 has a high quality crystalline nature, so that it is possible to prevent a defect at an interface between the first beryllium oxide layer 2 and the diamond semiconductor layer 3, prevent scattering of electrons or holes deriving from a defect at the interface and improve carrier mobility of the semiconductor device 200.

Figure 5:
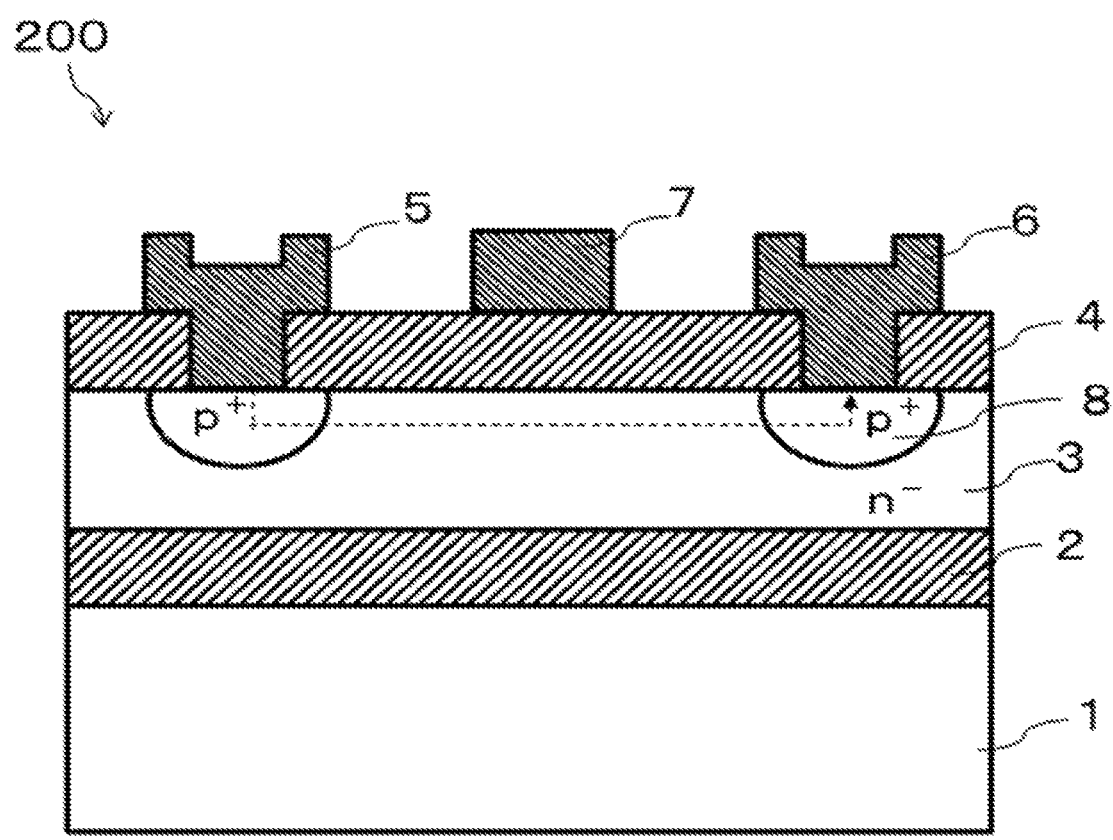
FIG. 5 is a schematic cross-sectional view of a semiconductor device according to a second embodiment.
Figure 6:
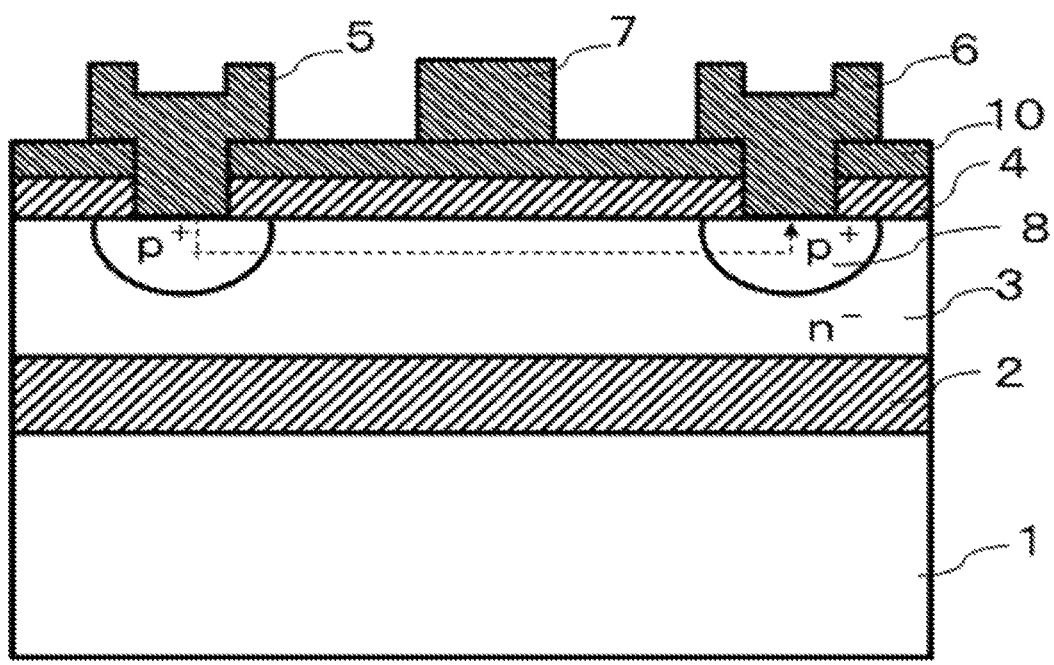
FIG. 6 is a schematic cross-sectional view of the semiconductor device according to the second embodiment.

FIG. 6 illustrates a semiconductor device 200A which is a modified example of the semiconductor device 200 in FIG. 5.

The semiconductor device 200A in FIG. 6 differs from the semiconductor device 200 in FIG. 5 in further including a second insulation layer 10 on the second beryllium oxide layer 4.

The semiconductor device 200A uses a laminated body 100A as a semiconductor layer.

The total thickness of the second beryllium oxide layer 4 and the second insulation layer 10 is desirably, for example, equal to or more than 3 nm and equal to or less than 1000 nm from a viewpoint of the insulation property. Particularly, to prevent leakage of carriers of the diamond semiconductor layer 3 to the side of the gate electrode, the total thickness of the second beryllium oxide layer 4 and the second insulation layer 10 is desirably, for example, equal to or more than 3 nm and equal to or less than 200 nm.

In addition, the conductivity type of the diamond semiconductor layer 3 in the semiconductor devices 200 and 200A has been described as the n-type and the conductivity type of the regions 8 has been described as the p-type. However, the conductivity type of the diamond semiconductor layer 3 may be the p-type, and the conductivity type of the regions 8 may be the n-type. In this case, a positive voltage is applied to the gate electrode 7 to cause the currents to flow to channels. When the positive voltage is applied to the gate electrode 7, these are electrons which become carriers in the diamond semiconductor layer 3 under the gate electrode 7, and the currents flow.

Third Embodiment

Figure 7:
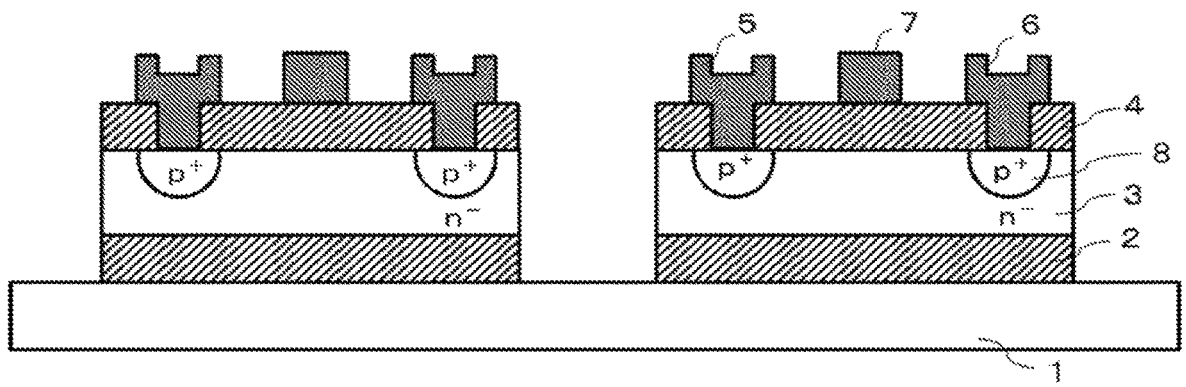
FIG. 7 is a schematic cross-sectional view of a semiconductor device according to a third embodiment.

FIG. 7 is a schematic cross-sectional view of a semiconductor device 300.

The same portions as those of a semiconductor device 200 in FIG. 5 will be assigned the same reference numerals, and description thereof will be omitted.

The semiconductor device 300 includes a plurality of FETs employing the same configuration as that of the semiconductor device 200 on one silicon layer 1.

In the semiconductor device 300, a first beryllium oxide layer 2, a diamond semiconductor layer 3 and a second beryllium oxide layer 4 are not provided on the entire surface of the silicon layer 1, and the individual FETs are formed at intervals on the silicon layer 1. Consequently, it is possible to suppress a stress produced at the interface of each of the first beryllium oxide layer 2, the diamond semiconductor layer 3 and the second beryllium oxide layer 4, and prevent an occurrence of cracks and bending of each layer.

In addition, the semiconductor device 300 in FIG. 7 has been described assuming that a plurality of FETs are the semiconductor devices 200 as an example. However, the semiconductor device 200 may be a semiconductor device 200A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising a laminated body comprising:
   a silicon layer;
   a first beryllium oxide layer on the silicon layer; and
   a diamond semiconductor layer on the first beryllium oxide layer,
   wherein a thickness of the first beryllium oxide layer is equal to or more than 2.66 A° and equal to or less than 50 A°,
   at least one first insulation layer selected from the group consisting of a second beryllium oxide layer,
   a silicon dioxide layer, an aluminum oxide layer, an aluminum silicate layer,
   and a hafnium oxide layer on the first insulation layer,
   a source electrode, a drain electrode and a gate electrode directly on the diamond semiconductor layer;
   wherein the first insulation layer is disposed between the gate electrode and the diamond semiconductor layer.

2. The semiconductor device according to claim 1, wherein a conductivity type of the diamond semiconductor layer is an n-type.

3. The semiconductor device according to claim 1, wherein a concentration of an n-type impurity contained in the diamond semiconductor layer is equal to or more than $1\times10^{15}$ cm$^{-3}$ and equal to or less than $1\times10^{22}$ cm$^{-3}$.

4. The semiconductor device according to claim 1, wherein a conductivity type of the diamond semiconductor layer is a p-type.

5. The semiconductor device according to claim 1, wherein a plane orientation of the silicon layer is a (111) plane, a plane orientation of the first beryllium oxide layer is a (0001) plane and a plane orientation of the diamond semiconductor layer is a (111) plane.

6. The semiconductor device according to claim 1, wherein the first insulation layer is the second beryllium oxide layer and the laminated body further comprises a second insulation layer on the second beryllium oxide layer.

7. The semiconductor device according to claim 6, wherein the second insulation layer is at least one oxide layer selected from the group consisting of a silicon dioxide, an aluminum oxide and a hafnium oxide.

8. The semiconductor device according to claim 1, wherein a thickness of the first beryllium oxide layer is equal to or more than 26.6 A and equal to or less than 50 A.

9. The semiconductor device according to claim 1, further comprising: a region included in the diamond semiconductor layer, disposed near a plane on which the source electrode and the diamond semiconductor layer are in contact and near a plane on which the drain electrode and the diamond semiconductor layer are in contact, and having a conductivity type.

10. The semiconductor device according to claim 9, wherein the region is a p-type.

11. The semiconductor device according to claim 10, wherein a concentration of a p-type impurity contained in the region is equal to or more than $1\times10^{19}$ cm$^{-3}$ and equal to or less than $1\times10^{22}$ cm$^{-3}$.

12. The semiconductor device according to claim 1, wherein the diamond semiconductor layer is an n-type.

13. The semiconductor device according to claim 12, wherein a concentration of an n-type impurity contained in the dial and semiconductor layer is equal to or more than $1 \times 10^{15}$ cm$^{-3}$ and equal to or less than $1 \times 10^{22}$ cm$^{-3}$.

14. The semiconductor device according to claim 9, wherein the region is an n-type.

15. The semiconductor device according to claim 14, wherein the diamond semiconductor layer is a p-type.

\* \* \* \* \*